(12) United States Patent
Parker et al.

(10) Patent No.: US 6,398,280 B1
(45) Date of Patent: Jun. 4, 2002

(54) GRIPPER AND COMPLEMENTARY HANDLE FOR USE WITH MICROCOMPONENTS

(75) Inventors: Eric G. Parker, Wylie; George D. Skidmore, Plano, both of TX (US)

(73) Assignee: Zyvex Corporation, Richardson, TX (US)

( * ) Notice: Subject to any disclaimer, the term of this patent is extended or adjusted under 35 U.S.C. 154(b) by 0 days.

(21) Appl. No.: 09/569,329

(22) Filed: May 11, 2000

(51) Int. Cl.[7] .............................................. B66C 1/42
(52) U.S. Cl. .................................................... 294/86.4
(58) Field of Search ......................... 294/86.4, 93, 97, 294/116; 901/30, 31, 39, 29

(56) References Cited

U.S. PATENT DOCUMENTS

| | | | |
|---|---|---|---|
| 4,018,409 A | * | 4/1977 | Burch et al. ................ 244/161 |
| 4,141,138 A | | 2/1979 | Quick |
| 4,740,410 A | | 4/1988 | Muller et al. ............... 428/133 |
| 4,852,242 A | * | 8/1989 | Tella et al. .................... 29/568 |
| 4,911,098 A | * | 3/1990 | Tabata ......................... 118/423 |
| 5,160,877 A | * | 11/1992 | Fujiwara et al. ....... 318/568.21 |
| 5,215,923 A | * | 6/1993 | Kinoshita et al. ............. 436/47 |
| 5,538,305 A | * | 7/1996 | Conway et al. .......... 294/119.1 |
| 5,645,684 A | | 7/1997 | Keller ...................... 156/643.1 |
| 5,660,680 A | | 8/1997 | Keller .......................... 438/50 |
| 5,895,084 A | * | 4/1999 | Mauro ........................ 294/100 |

FOREIGN PATENT DOCUMENTS

| | | |
|---|---|---|
| JP | 05 166973 | 7/1993 |
| JP | 06 061691 | 3/1994 |

OTHER PUBLICATIONS

A New Pick Up and Release Method by Heating for Micromanipulation, by F. Arai and T. Fukuda, 1997.
Handbook of Industrial Robotics, Shimon Y. Nof, Editor, Chapter 26 and Section 4.1.4.
Handbook of Industrial Robotics, Shimon Y. Nof, Editor, Second Edition, 1999, Chapter 5, pp. 43–78.
Hexsil Tweezers for Teleoperated Microassembly, by C. G. Keller and R. T. Howe, IEEE Micro Electro Mechanical Systems Workshop, 1997, pp. 72–77.
Microassembly Technologies for MEMS, by Michael B. Cohn et al.
Microfabricated High Aspect Ratio Silicon Flexures, Chris Keller, 1998.
Survey of Sticking Effects For Micro Parts Handling, by Ronald S. Fearing, 1995.
Abstract of JP 06 061691, Patent Abstracts of Japan, vol. 018, No. 299, Mar. 4, 1994.
Abstract of JP 05 166973, Patent Abstracts of Japan, vol. 017, No. 568, Jul. 2, 1993.

* cited by examiner

*Primary Examiner*—Donald P. Walsh
*Assistant Examiner*—Mark J. Beauchaine
(74) *Attorney, Agent, or Firm*—Fulbright & Jaworski L.L.P.

(57) ABSTRACT

A system and method which provide a gripping mechanism and a complementary "handle," which enable a microcomponent to be grasped with the gripping mechanism are disclosed. A preferred embodiment provides a gripper and a complementary handle, which is implemented on a microcomponent to be grasped, to enable the gripper to effectively grasp the microcomponent by grasping the complementary handle implemented for such component. A preferred embodiment provides a gripper and a complementary handle that is implemented on a microcomponent to enable the microcomponent to be accurately picked-and-placed with the gripper. The complementary handle may be an integrated part of the microcomponent to be grasped, or the handle may be a separate component that is capable of being permanently or temporarily coupled to a microcomponent. Most preferably, the gripper and complementary handle may be implemented to constrain all six degrees of freedom, both translational and rotational, of a grasped handle relative to the gripper.

138 Claims, 7 Drawing Sheets

GRIPPER AND COMPLEMENTARY HANDLE FOR USE WITH MICROCOMPONENTS

RELATED APPLICATIONS

This application is related to concurrently filed and commonly assigned U.S. patent application Ser. Nos. 09/569,330 entitled "METHOD AND SYSTEM FOR SELF-REPLICATING MANUFACTURING STATIONS," 09/570,170 entitled "SYSTEM AND METHOD FOR COUPLING MICROCOMPONENTS," and 09/569,328 entitled "RIBBON CABLE AND ELECTRICAL CONNECTOR FOR USE WITH MICROCOMPONENTS," filed May 11, 2000, the disclosures of which are hereby incorporated herein by reference.

TECHNICAL FIELD

The present invention relates in general to mechanisms for grasping microcomponents, and in specific to a complementary gripper and handle for grasping microcomponents.

BACKGROUND

Extraordinary advances are being made in micromechanical devices and microelectronic devices. Further, advances are being made in MicroElectroMechanical System ("MEMS") devices, which comprise integrated micromechanical and microelectronic devices. The terms "microcomponent" and "microdevice" will be used herein generically to encompass microelectronic components, micromechanical components, as well as MEMs components. A need exists in the prior art for a suitable mechanism for picking and placing microcomponents. For example, a need exists for some type of "gripper" device that is capable of grasping a microcomponent and maintaining a rigid grasp of the microcomponent while placing the microcomponent in a desired position. For instance, such a gripper device may be included as part of a robotic device, such as a robotic arm, to allow the robotic device to perform pick and place operations with microcomponents. Such pick and place operations may be performed, for example, in assembling/arranging individual microcomponents into larger systems.

Various types of "gripper" mechanisms are well known for large scale components. For example, mechanisms such as tweezers, clamps, robotic hands, and a variety of other types of gripping mechanisms are well known and commonly used for gripping large scale components. However, such gripping mechanisms for large scale components are generally difficult to implement on such a small scale as necessary for gripping microcomponents. That is, many large scale gripping mechanisms are unacceptable and are not easily adaptable for use in gripping microcomponents.

Turning to FIG. 1, an example of utilizing a gripper to perform pick-and-place operations for a microcomponent is illustrated. Starting in block 10, a gripper 102 is shown, which may be utilized to pick up a microcomponent 104 and attempt to place microcomponent 104 in a desired (or "target") location 106. In block 20, the gripper 102 approaches the microcomponent 104 in an attempt to position itself to grasp microcomponent 104. Due to the sticking effects present with such small-scale components (as discussed in more detail hereafter), microcomponent 104 may be attracted to the gripper 102 as the gripper 102 makes its approach toward microcomponent 104. Accordingly, as shown in block 20, such attraction may result in difficulty in the gripper 102 obtaining a firm grasp on the microcomponent 104. Block 30 illustrates gripper 102 having grasped microcomponent 104, and gripper 102 has picked up microcomponent 104. Thereafter, the gripper 102 may reposition the microcomponent 104, and place the microcomponent 104 on the desired location 106, as shown in block 40. Gripper 102 may then release the microcomponent 104, as shown in block 50. As further shown in block 50, however, releasing the microcomponent 104 may be difficult due to the sticking effects present with such small-scale components. Thus, microcomponent 104 may adhere to gripper 102. as the gripper 102 attempts to release the microcomponent 104, resulting in the microcomponent 104 being misaligned (or "incorrectly positioned") respective to the target location 106.

As FIG. 1 demonstrates, while such pick-and-place operations initially appear to be relatively simple, when working with microcomponents, such pick and place operations are very complex. In the micro world, the relative importance of the forces that operate is very different from that in the macro world. For example, gravity is usually negligible, while surface adhesion and electrostatic forces dominate. (See e.g., *A survey of sticking effects for micro parts handling*, by R. S. Fearing, IEEE/RSJ Int. Workshop on Intelligent Robots and Systems, 1995; *Hexsil tweezers for teleoperated microassembly*, by C. G. Keller and R. T. Howe, IEEE Micro Electro Mechanical Systems Workshop, 1997, pp. 72–77; *Microassembly Technologies for MEMS*, by Micheal B. Cohn, Karl F. Böhringer, J. Mark Noworolski, Angad Singh, Chris G. Keller, Ken Y. Goldberg, and Roger T. Howe; and *Handbook of Industrial Robotics*, by Shimon Y. Nof, chapter 5). Due to scaling effects, forces that are insignificant at the macro scale become dominant at the micro scale (and vice versa). For example, when parts to be handled are less than one millimeter in size, adhesive forces between a gripper and an object can be significant compared to gravitational forces. These adhesive forces arise primarily from surface tension, van der Waals, and electrostatic attractions and can be a fundamental limitation to handling of microcomponents. While it is possible to fabricate miniature versions of conventional robot grippers in the prior art, overcoming adhesion effects for such small-scale components has been a recognized problem.

Often in attempting to place a microcomponent in a desired location, the component will "stick" or adhere to the placing mechanism due to the aforementioned surface adhesion forces present in microassembly, making it very difficult to place the component in a desired location. (See e.g., *Microfabricated High Aspect Ratio Silicon Flexures*, Chris Keller, 1998). For example, small-scale "tweezers" (or other types of "grippers") may be used to perform such pick-and-place operations of microcomponents, and often such a component will adhere to the tweezers rather than the desired target location, making placing the component very difficult. It has been recognized in the prior art that to grip microcomponents and then attach them to the workpiece in the desired orientation, it is essential that a hierarchy of adhesive forces be established. For instance, electrostatic forces due to surface charges or ions in the ambient must be minimized. Adhesion of the micropart to the unclamped gripper surfaces (with zero applied force) should be less than the adhesion of the micropart to the substrate, to allow precise positioning of the part in the gripper.

Accordingly, unconventional approaches have been proposed for performing the pick-and-place operations. For example, Arai and Fukada have built manipulators with heated micro holes. See *A new pick up and release method by heating for micromanipulation*, by F. Arai and T. Fukada, IEEE Micro Electro Mechanical Systems Workshop, 1997, pp. 383–388). When the holes cool, they act as suction cups whose lower pressure holds appropriately shaped objects in place. Heating of the cavities increases the pressure and causes the objects to detach from the manipulator. Alternatively, some type of external adhesive (e.g., a type of liquid "glue") may be utilized to enable the microcomponent to be placed in a desired location. That is, an external adhesive may be required to overcome the adhesive force between the component and the placing mechanism (e.g., tweezers). For example, the target spot on the workpiece may have a surface coating that provides sufficiently strong adhesion to exceed that between the microcomponent and the unclamped gripper.

With the advances being made in microcomponents, various attempts at developing a suitable gripper mechanism for performing pick-and-place operations have been proposed in the prior art. (See e.g., *Handbook of industrial Robotics*, by Shimon Y. Nof, chapter 5). However, gripper mechanisms of the prior art are problematic in that they typically do not allow for a microcomponent to be accurately positioned. One factor that commonly decreases the accuracy in the placement of a microcomponent by prior art grippers is the above-described sticking effects between the gripper and the microcomponent.

Prior art grippers commonly rely on frictional forces between the gripper and the component for performing pick-and-place operations. For example, a small-scale pair of tweezers may be utilized to squeeze against the outer edges of a component, thereby grasping the component. The pair of tweezers relies on frictional forces between the surface of the tweezers and the gripped component to prevent the gripped component from slipping out of the tweezers grasp. Prior art grippers typically grasp a component in a manner that results in a relatively large amount of surface contact between the gripper and the component. While such a large amount of surface area in contact between the gripper and the component assists the prior art grippers in maintaining a grasp on the component, it makes releasing the component very difficult because of the above-described sticking effects present.

Additionally, prior art gripper mechanisms typically do not maintain sufficient rigidity of a gripped component, as the component is being repositioned. While rigidity may be provided in one dimension by grippers of the prior art, the provided rigidity is typically insufficient in another dimension. Also, the rigidity supplied by prior art grippers is typically a result of friction between the gripper and the gripped component. Thus, a relatively large amount of surface area contact between the component and the gripper may assist in maintaining rigidity in a given dimension, but such large surface area contact results in difficulty in releasing the component because of the above-described sticking effects.

Furthermore, prior art grippers typically provide no self-alignment mechanism to aid in positioning the gripper such that it grasps the component to be picked and placed in a particular manner and/or on a particular portion of the component. For example, prior art grippers typically include no mechanism that assists the gripper during its approach to the component to allow the gripper to engage the component in an optimum fashion for picking and placing the component. For certain pick-and-place operations it may be desirable for a gripper to grasp a component on a particular portion of the component and/or in a manner such that the component has a particular orientation relative to the gripper. For example, in microassembly operations, it may be desirable to grip a component such that the component has a known orientation/position in relation to the gripper to enable the gripper to more efficiently place the component in a desired location. Additionally, it may be desirable to grasp a component on a particular portion of the component for a variety of reasons, including for the purpose of reducing the likelihood of damaging "sensitive" portions of the component or achieving a firm grasp of the component. Given that prior art grippers typically provide no self-alignment (or positioning) mechanism with respect to a component, it is typically difficult to grasp a component in a desired fashion, particularly in view of the attractive forces commonly present between the gripper and the component during the gripper's approach toward the component (as shown and discussed above in conjunction with block 20 of FIG. 1).

An example of one type of prior art gripper is the micro-tweezer taught by Keller in *Microfabricated High Aspect Ratio Silicon Flexures*. Turning to FIG. 2, micro-tweezer 200 of the prior art is shown. As shown, tweezer 200 includes arms 201 and 202, which are used to grasp a component 204 (shown as a micro-gear in FIG. 2) by applying a compression force F with arms 201 and 202 against component 204. As illustrated in FIG. 2, tweezer 200 relies not only on the compression force F to maintain a grasp on the component 204, but also relies on frictional forces between the arms 201 and 202 of the tweezer 200 and the surface of the component 204. For instance, such frictional force between the tweezer's arms and the component are relied on to prevent the component from slipping out of the grasp of the tweezers along the Y axis of FIG. 2.

Also, the frictional force between the tweezer's arms 201 and 202 and the component 204 aids in providing rigidity between the tweezer 200 and the component 204. Relatively firm rigidity is provided along the X axis of FIG. 2 by the grasp of the tweezer 200 on the component 204. That is, the grasp of tweezer 200 on component 204 works to prevent the component 204 from moving along the X axis relative to the tweezer 200, thereby maintaining rigidity between the tweezer 200 and the component 204 along the X axis. However, much less rigidity is present between the component 204 and the tweezer's arms 201 and 202 along the Y and Z axes of FIG. 2. That is, much less force would be required to be applied against the component 204 to cause the component 204 to move along the Y or Z axis respective to the tweezer's arms 201 and 202 than would be required to cause the component 204 to move along the X axis respective to the tweezer's arms 201 and 202. More specifically, the tweezer design of FIG. 2 relies on the frictional forces between the tweezer's arms 201 and 202 and the component 204 to provide rigidity along the Y and Z axes, which does not provide as much rigidity as provided by the actual engagement of the tweezer's arms 201 and 202 on the component 204 along the X axis. Thus, the tweezer 200 fails to provide desirable rigidity in all three dimensions (i.e., the X, Y, and Z dimensions).

As also shown in FIG. 2, this design results in a relatively large amount of surface area contact between the component 204 and the tweezer's arms 201 and 202. As discussed above, such surface area contact is relied on by the tweezer design in that the frictional forces between the tweezer's arms 201 and 202 and the component 204 aid the tweezer 200 in grasping component 204. As a result, the above-described problems associated with sticking effects are prevalent in this design, causing difficulty in releasing the component 204 and accurately placing the component 204 on a target location. As can also be seen from the prior art design of FIG. 2, no aligning/positioning mechanism is provided to assist the tweezer 200 in grasping the component 204 in a desired fashion. For example, no alignment/ positioning mechanism is provided to aid the tweezer 200 in grasping the component 204 on a desired portion of component 204, such as in the center of component 204. Accordingly, it may be very difficult to grasp the component 204 on a desired portion (e.g., in the center portion of component 204), and the tweezer 200 may instead achieve a grasp on a less desirable portion of component 204 (e.g., near the top or the bottom of the component 204). Additionally, no aligning/positioning mechanism is provided to aid the tweezer 200 in grasping the component 204 such that the component 204 has a particular orientation relative to the tweezer 200 once grasped. For example, the micro-gear 204 of FIG. 2 may rotate as the tweezer approaches it (due to attraction forces) making it difficult for the tweezer 200 to achieve a grasp of the micro-gear having a particular orientation relative to the tweezer 200. Given the attraction forces present on such a small-scale, the difficulty in tweezer 200 grasping the component 204 in a desired fashion is further increased.

To further assist in grasping an object with a gripper, the prior art has suggested implementing a gripper having an object-shaped cavity. (See e.g., *Handbook of Industrial Robotics*, by Shimon Y. Nof, Section 4.1.4). That is, the prior art has suggested implementing a gripper having a cavity that is shaped to correspond to the shape of a microcomponent to be grasped. The prior art teaches that having a cavity shaped to correspond to a component to be gripped, assists the gripper in picking up the component. Of course, such an object-shaped cavity on the gripper designed to match a first object does not match another object having a different size and/or shape. Thus, while a cavity may be shaped to conform to the size and shape of one component, it will not provide a matching cavity for components of other shapes and sizes. Thus, many grippers, each having a cavity of a different shape and size, may be required to enable one to perform pick-and-place operations with a variety of components. Furthermore, having such an object-shaped cavity implemented within a gripper does not alleviate many of the above-described problems of prior art grippers, such as the relatively large amount of surface contact between the gripper and the component, which results in difficulty in releasing and accurately placing the component on a target location.

Generally, the focus of designing prior art grippers has been on developing grippers suitable for grasping existing components. Thus, some prior art gripper designs have been directed toward gripping particular types of components, e.g., components having a particular shape and/or size. To this point, the prior art has failed to focus on adapting the components to be grasped in any manner to make such components more suitable for being gripped by a gripper. That is, prior art developments have focused solely on modifying the gripper designs to adapt to various components, without directing efforts to implement components to be more receptive or complementary of a gripper.

SUMMARY OF THE INVENTION

In view of the above, a desire exists for a gripping mechanism suitable for performing accurate pick-and-place operations with microcomponents. Also, a desire exists for a gripping mechanism that may be implemented such that a relatively small amount of surface contact is present between the gripping mechanism and the component, thereby reducing the amount of surface sticking present when releasing the component. A further desire exists for a gripping mechanism that may be implemented in a manner such that the gripping mechanism does not rely on friction between the gripping mechanism and the component to maintain rigidity therebetween, thus further allowing for ease in releasing a grasped component. Still a further desire exists for a gripping mechanism that is implemented in a manner such that it is self-aligning to a desired position on the component to be grasped, thereby allowing for the gripping mechanism to grasp the component in a desired fashion with the component having a known orientation with respect to the gripping mechanism.

These and other objects, features and technical advantages are achieved by a system and method which provide a gripping mechanism and a complementary "handle," which enable a microcomponent to be grasped with the gripping mechanism. A preferred embodiment provides a gripper and a complementary handle, which is implemented on a microcomponent to be grasped, to enable the gripper to effectively grasp the microcomponent by grasping the complementary handle implemented for such component. A preferred embodiment provides a gripper and a complementary handle that is implemented on a microcomponent to enable the microcomponent to be accurately picked-and-placed with the gripper. The complementary handle may be an integrated part of the microcomponent to be grasped, or the handle may be a separate component that is capable of being permanently or temporarily coupled to a microcomponent. Most preferably, the gripper and complementary handle may be implemented to constrain all six degrees of freedom, both translational and rotational, of a grasped handle relative to the gripper. However, various implementations may constrain certain degrees of freedom of a grasped handle more or less than other degrees of freedom, relative to the gripper. Furthermore, the gripper and complementary handle may be implemented to constrain less than all six degrees of freedom of a grasped handle relative to the gripper, and any such implementation is intended to be within the scope of the present invention.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims. The novel features which are believed to be characteristic of the invention, both as to its organization and method of operation, together with further objects and advantages will be better understood from the following description when considered in connection with the accompanying figures. It is to be expressly understood, however, that each of the figures is provided for the purpose of illustration and description only and is not intended as a definition of the limits of the present invention.

BRIEF DESCRIPTION OF THE DRAWING

For a more complete understanding of the present invention, and the advantages thereof, reference is now made to the following descriptions taken in conjunction with the accompanying drawing, in which.

DETAILED DESCRIPTION

Figure 1:
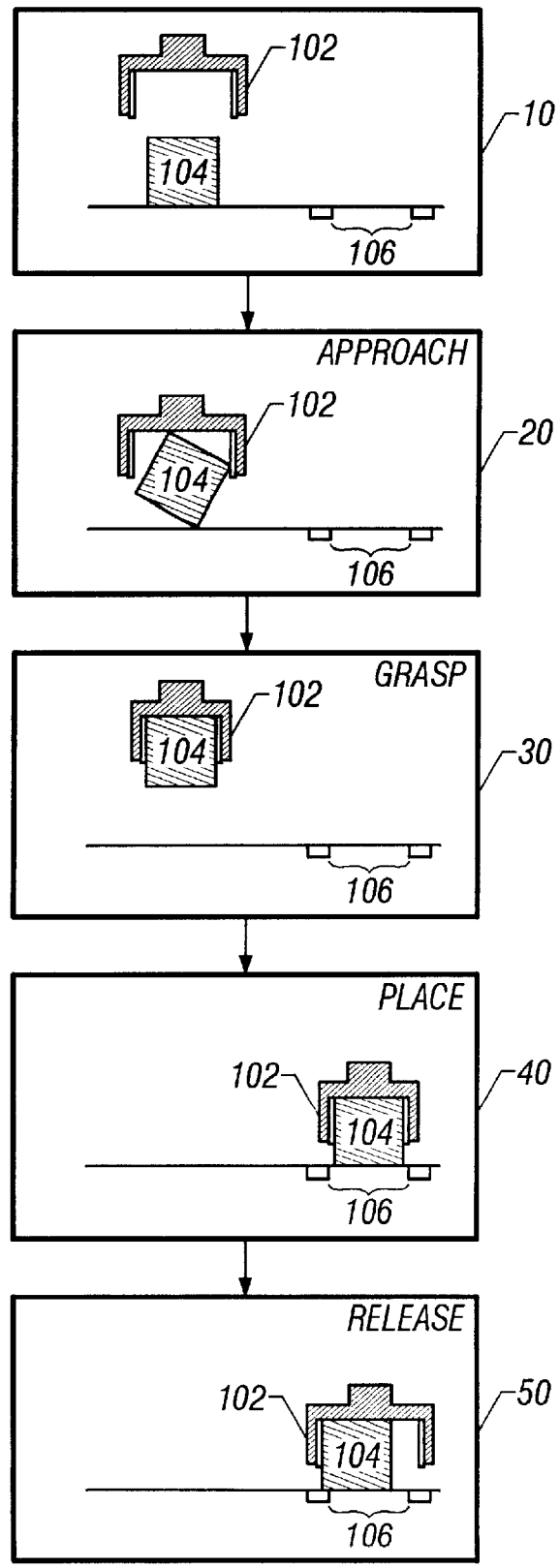
FIG. 1 shows an example of utilizing a gripper to perform pick-and-place operations for a microcomponent in the prior art.
Figure 2:
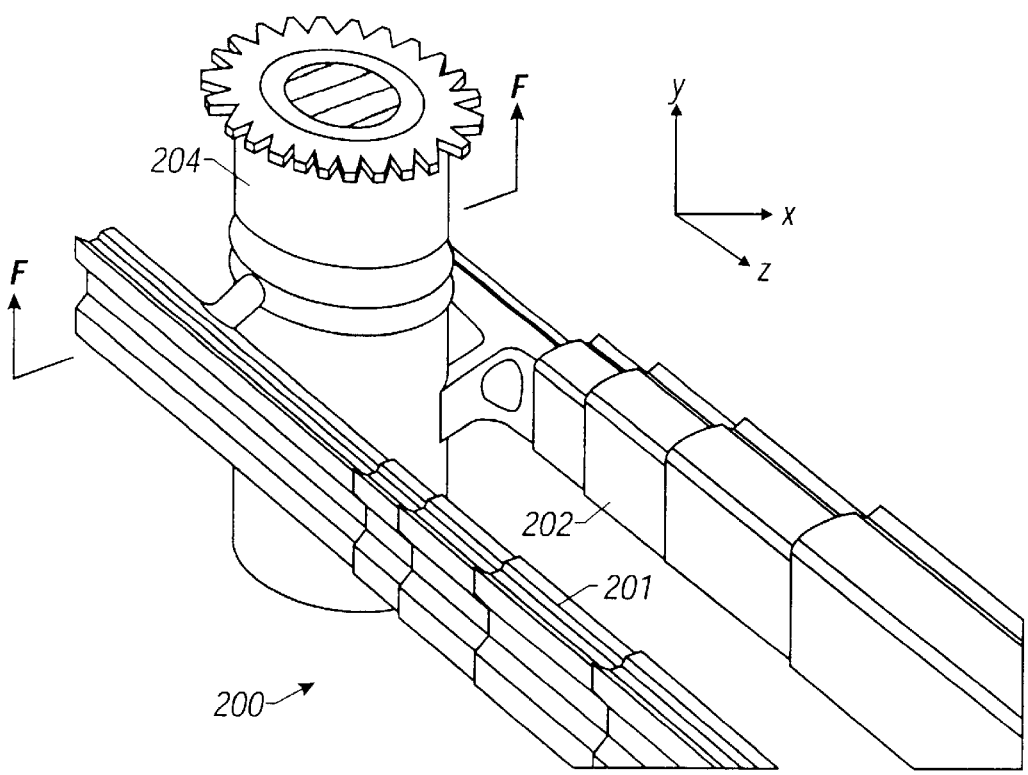
FIG. 2 shows an exemplary implementation of a micro-tweezer gripper of the prior art.
Figure 3:
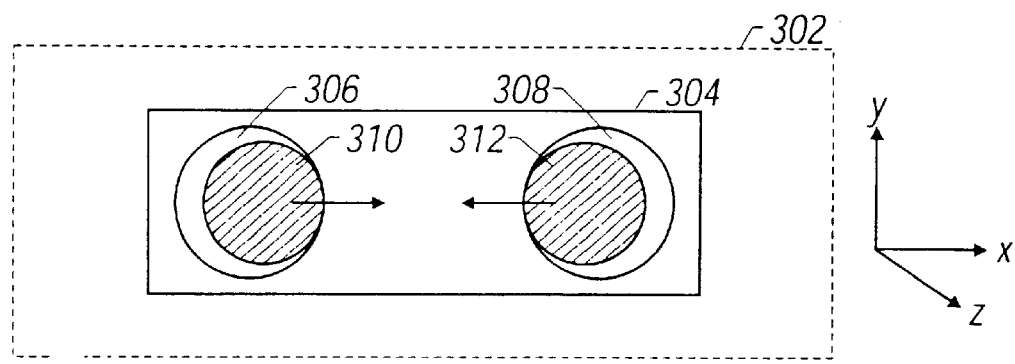
FIG. 3 shows a relatively simple exemplary implementation of a handle/gripper combination of the present invention.

A preferred embodiment of the present invention utilizes a "handle" on a component, wherein such handle is complementary to a gripper to enable the gripper to effectively grasp the component in a manner that allows for accurate pick-and-place operations to be performed on the component. Turning to FIG. 3, a relatively simple example of such a handle/gripper combination is provided. FIG. 3 shows a top view of a component 302, which is implemented having a handle 304. As will become more clear hereafter, such handle 304 may aid in positioning a gripper (e.g., tweezers or other type of gripping device) and aid such gripper in obtaining a desirable, rigid grasp of such handle. In this exemplary implementation, handle 304 comprises two circular apertures 306 and 308. Further shown is a portion of a gripper that comprises two circular prongs 310 and 312. For instance, such gripper may be similar to the tweezers described in FIG. 2 with the tweezer's arms being circular prongs 310 and 312. As illustrated in FIG. 3, the circular apertures 306 and 308 are preferably larger in circumference than that of the prongs 310 and 312, such that prongs 310 and 312 may be inserted into the apertures 306 and 308 of handle 304 to enable the gripper to perform pick-and-place operations on the component 302. For instance, the prongs 310 and 312 may be inserted into apertures 306 and 308, and then a compression force may be applied by the gripper causing the prongs 310 and 312 to apply an inward force against the inner surface of the walls of the circular apertures 306 and 308, as shown in FIG. 3. As a result of such compression force being applied by the prongs 310 and 312, the gripper may achieve a grasp of the handle 304, thereby enabling the gripper to perform pick-and-place operations on the associated component 302.

It should be recognized that the gripper of FIG. 3 may be implemented to apply expansive force, rather than compressive force, causing the prongs 310 and 312 to apply an outward force against the inner surface of the walls of the circular apertures 306 and 308 (e.g., in the opposite directions shown in FIG. 3). Some of the problems discussed above with prior art gripper designs may still be present in the exemplary implementation of FIG. 3, such as relatively large amount of surface contact between the gripper's prongs 310 and 312 and the inner walls of the handle's apertures 306 and 308, and the reliance on friction between the gripper's prongs 310 and 312 and the inner walls of the handle's apertures 306 and 308 for rigidity along the Z axis of FIG. 3. However, the implementation of such handle 304 within component 302 provides advantages not available in the prior art. For example, the handle 304 can be positioned on the component 302 to ensure that the gripper grasps the component 302 in a desired fashion. For instance, once the gripper's prongs 310 and 312 have grasped the handle 304, then component 302 has a known orientation with respect to the gripper. Furthermore, the handle provides a mechanism that is complementary to the gripper, which enables the gripper to achieve a suitable grasp of the associated component 302, irrespective of the size and shape of the associated component 302. Thus, by implementing the complementary handle for the gripper on an associated component 302, the gripper can achieve a suitable grasp of the associated component 302 irrespective of the associated component's shape or size because the gripper engages the complementary handle 304, rather than otherwise adapting to the component 302 for grasping such component 302.

It should be recognized that handle 304 may be an integrated part of component 302. For example, component 302 may be fabricated such that it includes handle 304. Alternatively, handle 304 may be fabricated separate from component 302, and then coupled to component 302 (either permanently or temporarily) to provide a suitable gripping mechanism on component 302 for a gripper. For example, handle 304 may be a separate component that is coupled to component 302 utilizing a coupling mechanism disclosed in co-pending and commonly assigned U.S. patent application Ser. No. 09/570,170 entitled "SYSTEM AND METHOD FOR COUPLING MICROCOMPONENTS," the disclosure of which is hereby incorporated herein by reference. Furthermore, handle 304 may be arranged in a desirable manner on the component 302. For example, handle 304 may be arranged in the optimum position on component 302 to enable a gripper to perform pick-and-place operations on the component 302. Also, handle 304 may be arranged so as not to interfere with the functionality of component 302. For instance, handle 304 may be recessed within component 302, such that it is not protruding from component 302 in a manner that may potentially interfere with the desired functionality of component 302.

Figure 4:
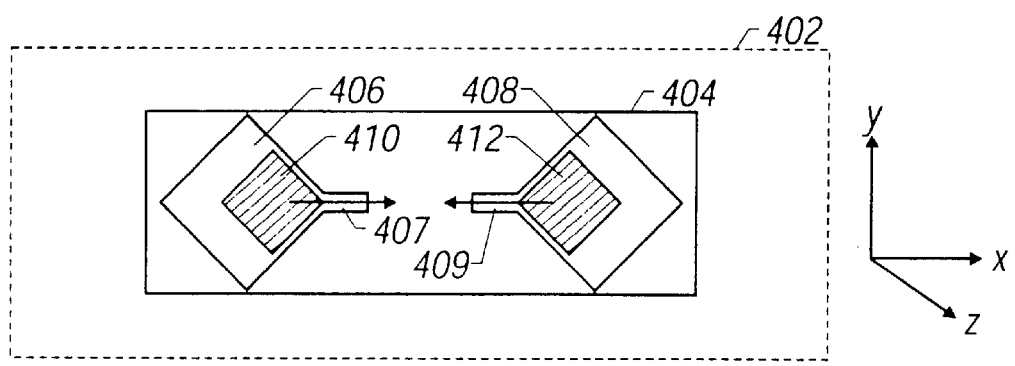
FIG. 4 shows another relatively simple exemplary implementation of a handle/gripper combination of the present invention.

Turning now to FIG. 4, another exemplary implementation of a gripper/handle combination is illustrated. FIG. 4 shows a top view of a component 402, which is implemented having a handle 404. In this exemplary implementation, handle 404 comprises two substantially diamond-shaped apertures 406 and 408. As shown in FIG. 4, in this implementation the facing corners of the diamond-shaped apertures 406 and 408 include notches 407 and 409. Further shown is a gripper that comprises two diamond-shaped prongs 410 and 412. For instance, such gripper may be similar to the tweezers described in FIG. 2 with the tweezer's arms being diamond-shaped prongs 410 and 412. As illustrated in FIG. 4, the apertures 406 and 408 are preferably larger in size than that of the prongs 410 and 412, such that prongs 410 and 412 may be inserted into the apertures 406 and 408 of handle 404 to enable the gripper to perform pick-and-place operations on the component 402. For instance, the prongs 410 and 412 may be inserted into apertures 406 and 408, and then a compression force may be applied by the gripper causing the prongs 410 and 412 to apply an inward force against the inner surface of the walls of the apertures 406 and 408, as shown in FIG. 4. In this exemplary implementation, the notches 407 and 409 aid in aligning the prongs 410 and 412 within the apertures 406 and 408 in a manner such that the faces of the diamond-shaped prongs contact the inner walls of the apertures. As a result of such compression force being applied by the prongs 410 and 412, the gripper may achieve a grasp of the handle 404, thereby enabling the gripper to perform pick-and-place operations on the associated component 402, in a similar manner as described above for FIG. 3.

It should be recognized that the gripper of FIG. 4 may be implemented to apply expansive force, rather than compressive force, causing the prongs 410 and 412 to apply an outward force against the inner surface of the walls of the apertures 406 and 408 (e.g., in the opposite directions shown in FIG. 4). Similarly, the notches 407 and 409 may be implemented on the opposite corners of their respective apertures. Again, some of the - * problems discussed above with prior art gripper designs may still be present in the exemplary implementation of FIG. 4, such as relatively large amount of surface contact between the gripper's prongs 410 and 412 and the inner walls of the handle's apertures 406 and 408, and the reliance on friction between the gripper's prongs 410 and 412 and the inner walls of the handle's apertures 406 and 408 for rigidity along the Z axis of FIG. 4. However, just as discussed above with FIG. 3, the implementation of such handle 404 within component 402 provides advantages not available in the prior art. For example, the handle 404 can be positioned on the component 402 to ensure that the gripper grasps the component 402 in a desired fashion. For instance, once the gripper's prongs 410 and 412 have grasped the handle 404, then component 402 has a known orientation with respect to the gripper. Furthermore, the handle provides a mechanism that is complementary to the gripper, which enables the gripper to achieve a suitable grasp of the associated component 402, irrespective of the size and shape of the associated component 402. Thus, by implementing the complementary handle 404 on an associated component 402, the gripper can achieve a suitable grasp of the associated component 402 irrespective of the associated component's shape or size because the gripper engages the complementary handle 404, rather than otherwise being required to adapt to the component 402 for grasping such component 402.

Figure 5:
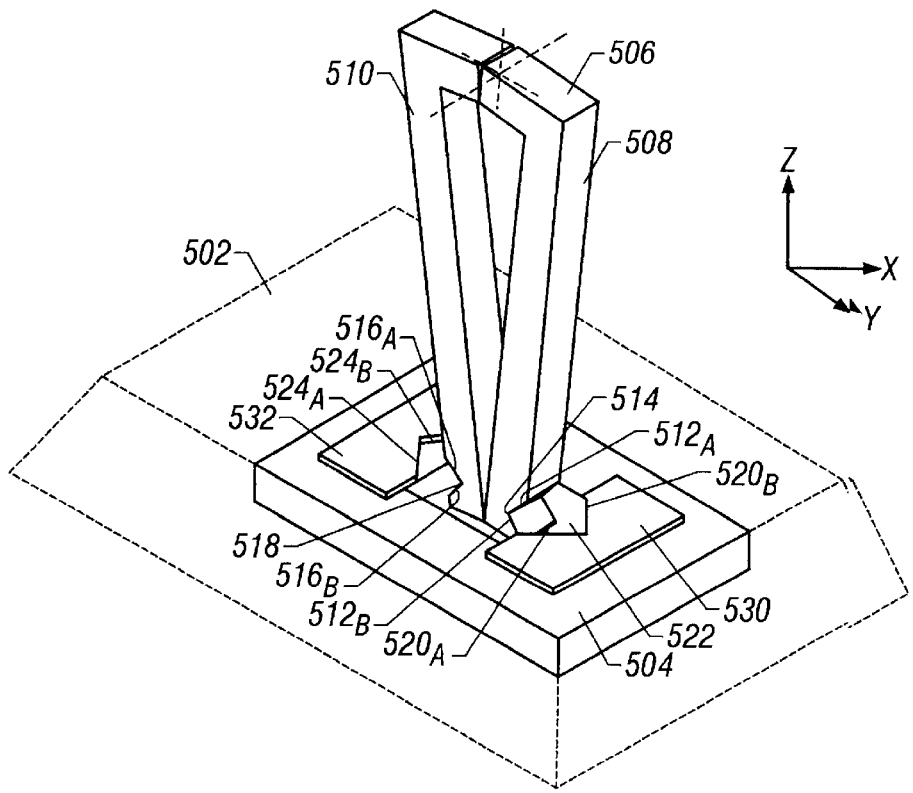
FIG. 5 shows an exemplary implementation of a preferred embodiment of the present invention.

Turning to FIG. 5, an exemplary implementation of a preferred embodiment of the present invention is shown. FIG. 5 is an isometric view from the front showing the front, top and right sides of an exemplary gripper and complementary handle. It should be understood, of course, that the labels used herein for describing orientation (e.g., front, back, top, right side, and left side) are merely for reference, and the embodiment may be disposed in any manner and still be within the scope of the present invention. As shown, a component 502 is implemented having a handle 504. In this exemplary implementation, handle 504 comprises an aperture 522 having two facing bevels 530 and 532 on opposing ends of the aperture. Bevel 530 includes two angled wedges, shown as $520_A$ and $520_B$, thereby forming a horizontal (or "lateral") notch along the X axis of FIG. 5. Similarly, the bevel 532 includes two angled wedges, shown as $524_A$ and $524_B$, thereby likewise forming a horizontal notch along the X axis of FIG. 5.

Further shown in FIG. 5 is a gripper 506 that comprises two prongs (or "arms") 508 and 510. In this exemplary implementation, the outer surface of arms 508 and 510 each include a notch within such arms 508 and 510 for engaging the opposing notches on the inner edge of the aperture of handle 504. The notches on the arms of gripper 506 may be referred to as vertical notches because the notches are along the Z axis of FIG. 5 when the gripper 506 is engaging the handle 504. The vertical notch of arm 508 includes two angled wedges $512_A$ and $512_B$, and a center line 514. Likewise, the vertical notch of arm 510 includes two angled wedges $516_A$ and $516_B$, and a center line 518.

It should be recognized that notches 530 and 532 of handle 504 aid in self-aligning 140 gripper 506 along the X axis of FIG. 5 (or horizontally), such that the gripper may grasp the handle in a desired fashion. More specifically, the wedges $520_A$ and $520_B$ work to direct an engaging arm (e.g., arm 508) of the gripper 506 toward a centered, equilibrium position, and wedges $524_A$ and $524_B$ work to direct an engaging arm (e.g., arm 510) of the gripper 506 toward a centered, equilibrium position. It should also be recognized that the vertical notches of the gripper's arms 508 and 510 aid in self-aligning gripper 506 along the Z axis of FIG. 5 (or vertically), such that the gripper may grasp the handle in a desired fashion. Accordingly, the horizontal notches of the handle 504 and the vertical notches of the arms of gripper 506 work to self-align the gripper 506 in a manner such that each arm 508 and 510 engage the bevels 530 and 532, respectively, at four points. That is, when the gripper 506 engages the handle 504, each arm's notch engages the respective bevel's notch at four points. As a result, the amount of surface area in contact while the gripper 506 grasps the handle 504 is very small.

Thus, as an example of the operation of the system of FIG. 5, arms 508 and 510 may be inserted into the aperture 522 of handle 504, and then an outward or expansive force may be applied by the gripper causing the arms 508 and 510 to apply an outward force against the inner surface of the bevels 530 and 532. As described above, in this exemplary implementation the notches of the gripper's arms and the notches of the bevels aid in aligning the gripper 506 in a manner such that a desirable grasp of the handle is achieved by the gripper 506. For instance, the front side (or front edge) of angled wedge $512_A$ shown in FIG. 5 may engage the upper side (or upper edge) of the wedge $520_A$ at a single point, and the front side (or front edge) of angled wedge $5122_B$ may engage the underside (or lower edge) of wedge $520_A$ at a single point. Similarly, the back side (or back edge) of angled wedge $512_A$ may engage the upper side (or upper edge) of the wedge $520_B$ at a single point, and the back side (or back edge) of angled wedge $512_B$ may engage the underside (or lower edge) of wedge $520_B$ at a single point. Thus, the center line 514 may not actually engage the notch of bevel 530. As a result of the notch of arm 508 engaging the notch of bevel 530 in this manner, only four points of contact (i.e., only four engagement points) are utilized for arm 508 to grasp the bevel 530 of handle 504.

The notch of arm 510 engages the notch of bevel 532 in a similar manner. For instance, the front side (or front edge) of angled wedge $516_A$ shown in FIG. 5 may engage the upper side (or upper edge) of the wedge $524_A$ at a single point, and the front side (or front edge) of angled wedge $516_B$ may engage the underside (or lower edge) of wedge $524_A$ at a single point. Similarly, the back side (or back edge) of angled wedge $516_A$ may engage the upper side (or upper edge) of the wedge $524_B$ at a single point, and the back side (or back edge) of angled wedge $516_B$ may engage the underside (or lower edge) of wedge $524_B$ at a single point. Thus, the center line 518 may not actually engage the notch of bevel 532. As a result of the notch of arm 510 engaging the notch of bevel 532 in this manner, only four points of contact (i.e., only four engagement points) are utilized for arm 510 to grasp the bevel 532 of handle 504. Therefore, a grasp of handle 504 may be achieved by gripper 506 in a manner such that a very small amount of surface area between the gripper 506 and handle 504 is in contact. Accordingly, sticking effects may be reduced, thereby allowing for an easier and more accurate release of the handle 504 by gripper 506. Thus, a more efficient and accurate placement of component 502 may be achieved utilizing gripper 506 in conjunction with complementary handle 504.

Figure 6:
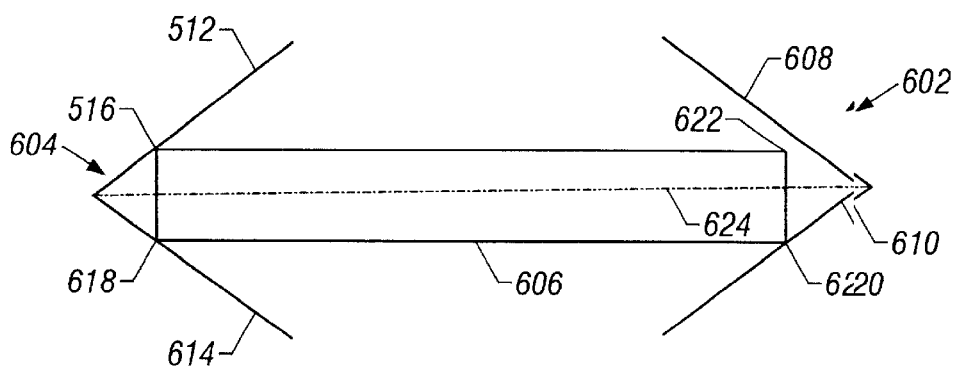
FIG. 6 shows an elevation view from the front, showing the front of exemplary notches that may be included within a gripper's arms and an exemplary bevel that may included within a complementary handle.

Turning to FIG. 6, operation of the notches of a gripper's arms and the notches of a handle's bevels of a preferred embodiment are further described. FIG. 6 is an elevation view from the front, showing the front of exemplary notches that may be included within a gripper's arms and an exemplary portion of a bevel that may included within a complementary handle. Again, the labels used herein for describing orientation (e.g., front, back, top, right side, and left side) are merely for reference, and the embodiment may be disposed in any manner and still be within the scope of the present invention. The exemplary configuration of FIG. 6 is shown for a gripper's arms that close inward (i.e., compress toward each other) to engage the handle's bevels, rather than expanding outward as in FIG. 5, but the principles described hereafter apply equally for each configuration. FIG. 6 shows a notch 602 that may be included within one arm of a gripper, and a notch 604 that may be included within another arm of such gripper. Further shown in FIG. 6 is an exemplary portion 606 of a bevel.

In this configuration, as the arms close inward to engage the bevel portion 606, one of the arms may contact bevel portion 606 first. The contact force between a first wedge of the arm's notch (e.g. wedge 614 of notch 604) and the bevel portion 606 will push the arm toward the hypothetical center line 624 of the bevel portion 606 until the other wedge of the arm's notch (e.g. wedge 612 of notch 604) contacts the bevel portion 606 on the opposite side of the bevel portion 606. At this point, the two opposing contacts will generate a net destabilizing torque which tends to rotate the arm away from the center line 624 of bevel portion 606. However, a wedge of a notch of the other arm (e.g. wedge 610 of notch 602) will come into contact with its respective bevel portion 606 as well. In general, in a most preferred embodiment there is one geometric configuration in which the wedges of the notches in both arms can be in contact with their respective bevel portions, and that is when the arms are fully centered and oriented along the center line 624 of bevel portion 606. The centering torque from the arm with a single point of contact will be larger than the destabilizing torque from the arm having two points of contact. If the entire gripper can be treated as a rigid body, then it will fully center and align itself with the bevel portion 606 to achieve a desired grasp of the handle. Once such a grasp of the handle is achieved by the gripper, the gripper may perform pick-and-place operations on the associated component.

As an example, FIG. 6 shows notches 602 and 604 as they initially engage bevel portion 606. As shown, the front side of wedge 612 is in contact with point 616 of the upper edge of the bevel portion 606, and the front side of wedge 614 is in contact with point 618 of the lower edge of the bevel portion 606. As discussed above, the back side of wedge 612 may be in contact with a point of the upper edge of bevel portion 606 and the back side of wedge 614 may be in contact with a point the lower edge of bevel portion 606, such that the notch 604 contacts the bevel at only four points. As further shown in FIG. 6, the gripper is not properly aligned with the bevel because the notch 602 has not fully grasped bevel portion 606. More specifically, the front side of wedge 610 of notch 602 is in contact with point 620 of the lower edge of the bevel portion 606. Likewise, the back side of wedge 610 may be in contact with the lower edge of the bevel portion 606. However, the wedge 608 of notch 602 is not in contact with the bevel portion 606. As discussed above, in a preferred embodiment, the gripper and complementary handle are self-correcting (or self-centering) such that as the gripper further compresses the arms toward each other, the gripper and/or bevel portion 606 will adjust such that each notch 602 and 604 are in contact with four points of the bevel portion 606. For example, the bevel portion 606 may adjust such that it is aligned with the center line 624, wherein the front side of wedge 608 will engage point 622 of the upper edge of bevel portion 606. Of course, the back side of wedge 608 may likewise engage a point of the upper edge of bevel portion 606.

Most preferably, the gripper, such as gripper 506 of FIG. 5, is implemented to engage the complementary handle on power off of the actuator for the gripper. For instance, in the exemplary implementation of FIG. 5, the gripper 506 most preferably moves outward upon power off of the actuator, resulting in power-off engagement of the handle 504. Therefore, the actuator is powered off when the gripper is transporting the component 502 to a target location. Such power-off engagement is desirable characteristic in that it reduces the required power consumption for pick-and-place operations because the gripper needs to only be powered upon approaching the handle and releasing the handle, rather than being powered during the entire time that the gripper engages (or grasps) the handle. Furthermore, if an interruption to power occurs, the gripper does not lose its grasp of the handle. It should be recognized, however, that the gripper and handle of FIG. 5 may be implemented such that the gripper applies a compressive force, rather than expansive force against the bevels of the handle 504.

The exemplary implementation of such preferred embodiment provides advantages not available in the prior art. As one example, the amount of surface area in contact between the gripper and the complementary handle of a grasped component is minimal, and is significantly less than that of prior art implementations. Thus, the sticking effects between the gripper and the complementary handle are minimized, thereby enabling an easier and more accurate release of the complementary handle. Accordingly, a more accurate placement of the associated component may be achieved utilizing the gripper and complementary handle. As a further example, the handle 504 can be positioned on the component 502 to ensure that the gripper 506 grasps the component 502 in a desired fashion. For instance, once the gripper's arms 508 and 510 have grasped the handle 504, then component 502 has a known orientation with respect to the gripper 506. Furthermore, the handle 504 provides a mechanism that is complementary to the gripper 506, which enables the gripper 506 to achieve a suitable grasp of the handle 504 in order to effectively pick up the associated component 502, irrespective of the size and shape of the associated component 502. Thus, by implementing the complementary handle 504 on an associated component 502, the gripper 506 can achieve a suitable grasp of the associated component 502 irrespective of the associated component's shape or size because the gripper 506 engages the complementary handle 504, rather than otherwise being required to adapt to the component 502.

It should be understood that many other implementations of a gripper and a complementary handle may be utilized to enable such a gripper to achieve a desirable grasp of a microcomponent associated with such complementary handle, and any such implementation is intended to be within the scope of the present invention. That is, many other implementations of a gripper and handle are possible which provide a complementary gripper and handle that together enable a desirable grasp to be achieved for an associated microcomponent, and any such implementation is intended to be within the scope of the present invention. Thus, the present invention is not intended to be limited only to the complementary gripper and handle implementations provided herein, rather such implementations are intended solely as examples that render the disclosure enabling for many other complementary gripper and handle implementations.

Figure 7:
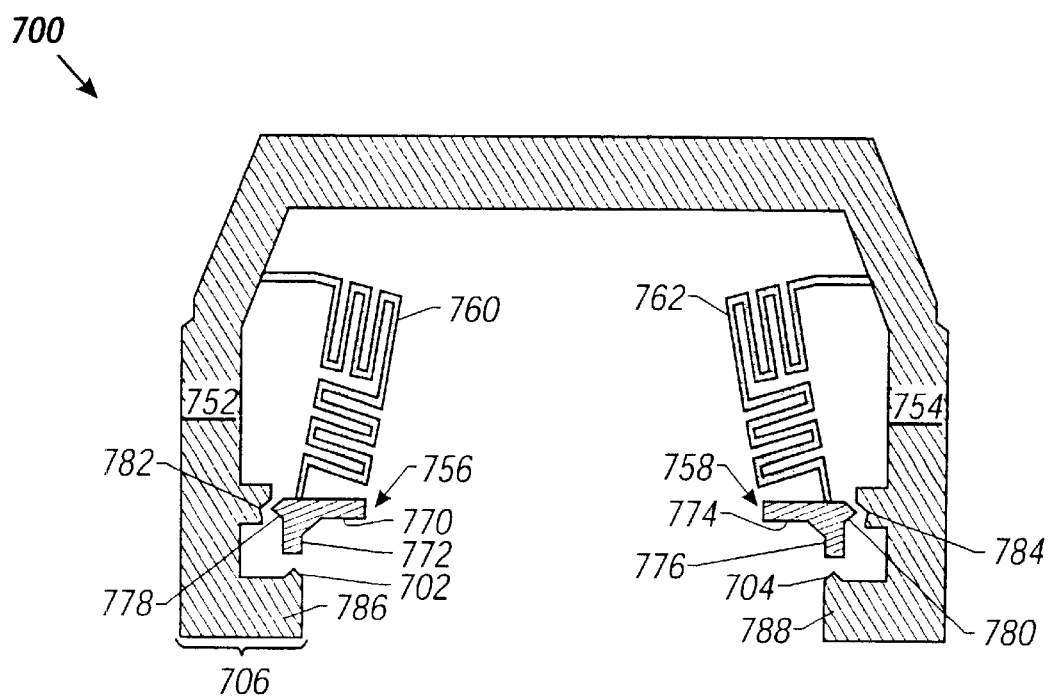
FIG. 7 shows an exemplary implementation of a clip gripper of an alternative embodiment of the present invention.
Figure 8A:
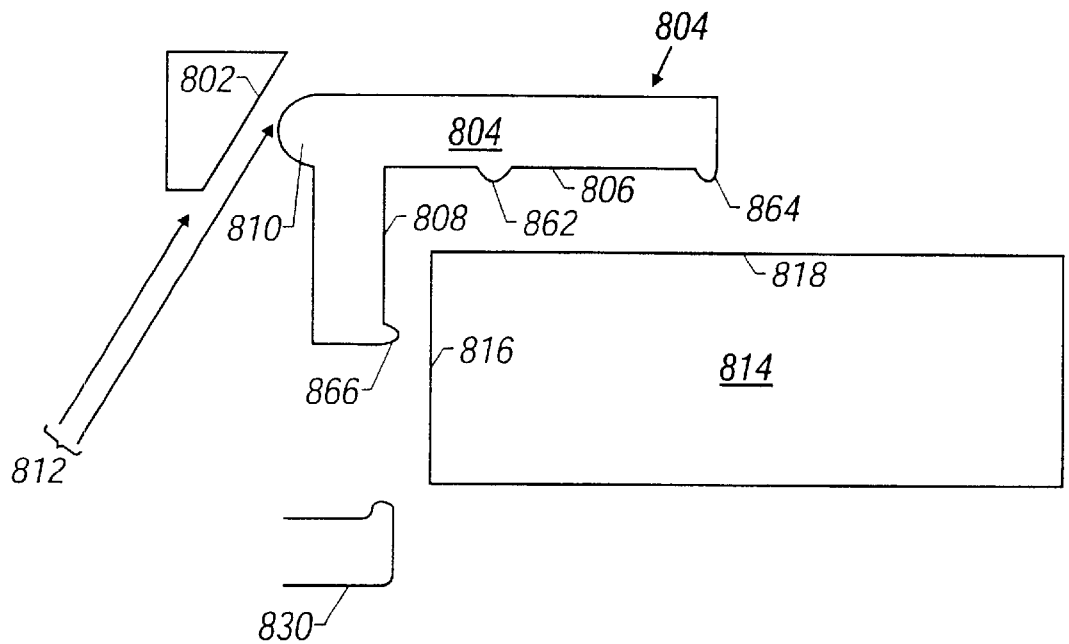
FIGS. 8A–8B show a preferred implementation of a clip that may be utilized within a gripper and/or a complementary handle.
Figure 8B:
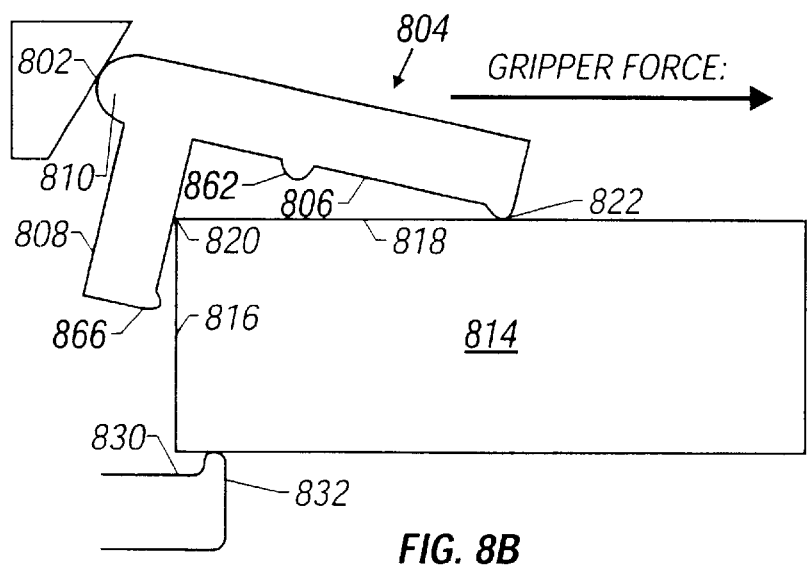
Figure 9:
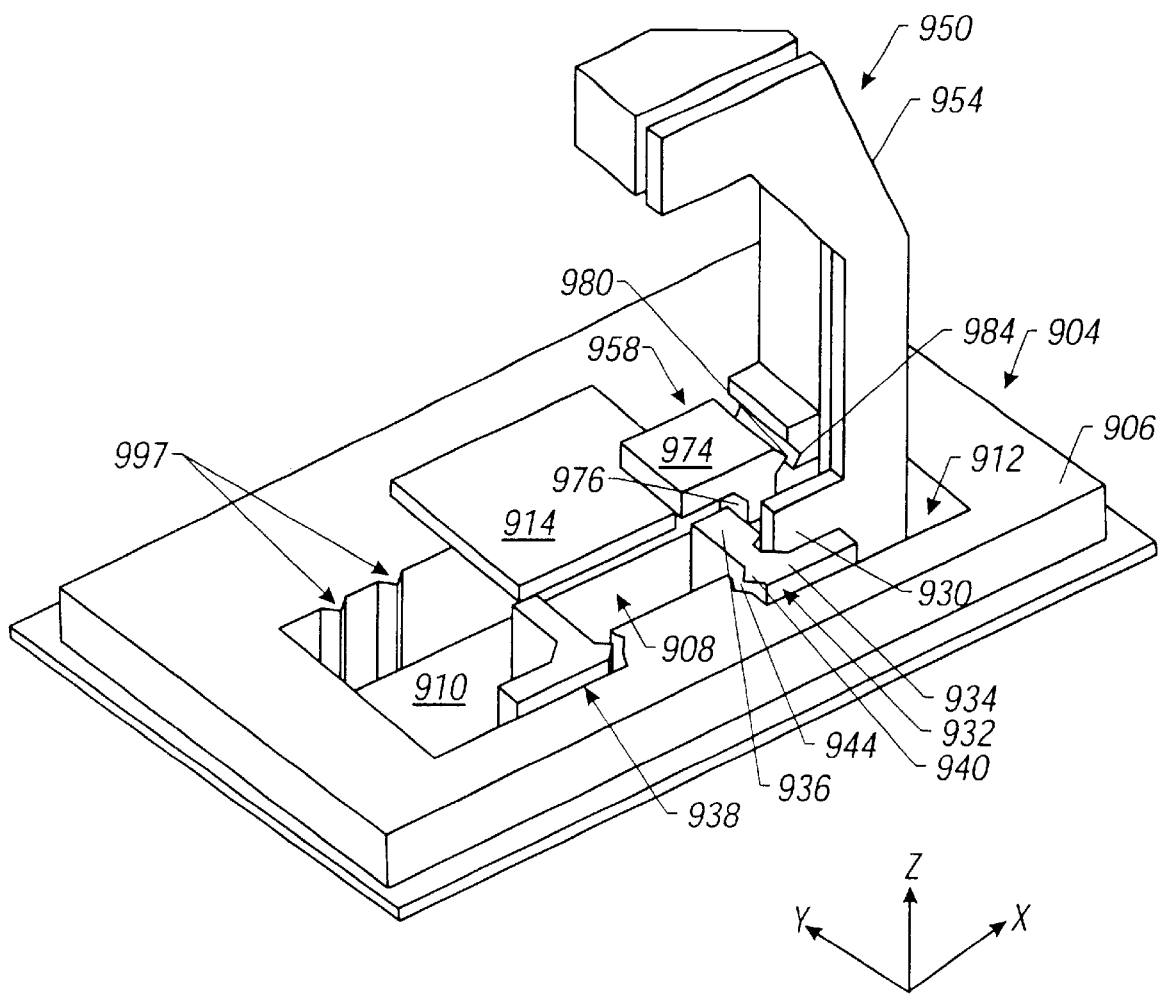
FIG. 9 shows an exemplary "dual clip" implementation in which both a gripper and a complementary handle are implemented having clips to aid the gripper and handle in rigidly engaging each other.

For instance, an exemplary implementation of an alternative embodiment of the present invention is shown and described in conjunction with FIGS. 7–9. The gripper of such an alternative embodiment may be referred to as a "clip gripper" and the handle of such an alternative embodiment may be referred to as a "clip handle." Turning first to FIG. 7, a gripper 700 is shown which may be used to grasp a complementary handle as described further in conjunction with FIG. 9 hereafter. Gripper 700 comprises two arms 752 and 754, which each have a range of motion to enable compression of the arms toward each other to grasp a handle. Gripper 700 further includes clips 756 and 758, which are springably coupled to arms 752 and 754, respectively. More specifically, clip 756 is coupled to arm 752 via spring 760, and clip 758 is coupled to arm 754 via spring 762. In the exemplary implementation of FIG. 7, each clip 756 and 758 includes two tabs that are arranged at approximately 90 degree angles to each other. Clip 756 includes tab 770, which may be referred to as a "horizontal tab," and tab 772, which may be referred to as a "vertical tab." Similarly, clip 758 includes horizontal tab 774 and vertical tab 776. Additionally, in the exemplary implementation of FIG. 7, each clip 756 and 758 includes a protruding wedge, which are shown as wedges 778 and 780. Further, each arm 752 and 754 includes a notch for receiving the protruding wedges 778 and 780 of the clips, such notches are shown as 782 and 784. Gripper 700 also includes base members 786 and 788, which extend from arms 752 and 754, respectively.

As further shown in the exemplary implementation of FIG. 7, the base members 786 and 788 may be implemented to include a protruding point or bump (or "dimple") to reduce the amount of surface area contact between the base members and a complementary handle. For instance, the point 702 may be protruding from the base member 786 to minimize the amount of surface area in contact between base member 786 and a complementary handle, as described more fully in conjunction with FIG. 9 hereafter. Likewise, the point 704 may be protruding from the base member 788 to similarly minimize the amount of surface area in contact between base member 788 and a complementary handle. Such reduction in surface area contact may aid in reducing the potential for friction while the gripper is closing, and may also reduce the surface forces present between the gripper and a grasped handle, thereby resulting in easier release of the grasped handle (i.e., reduces the sticking effects present between the gripper and a grasped handle). It should also be recognized that, as illustrated in the exemplary implementation of FIG. 7, the base members 786 and 788 may be implemented with a relatively short length 706. For example, as shown in FIG. 7, the base member 786 may extend from the arm 752 a length 706 such that the base member 786 ends approximately under the vertical tab 772 of clip 756. It should be recognized that such a length 706 is sufficient to place the point 702 of base member 786 in a position to engage a complementary handle as the gripper's arms close against the handle. Having a relatively short length 706 for base member 786 may be desirable in that it may allow for the base member to be more easily and efficiently inserted into an aperture of the complementary handle, as will become more clear in conjunction with the description of FIG. 9 hereafter.

As with the other exemplary implementations of grippers provided herein, the gripper 700 may be fabricated utilizing any of various fabrication techniques, including, as examples, those fabrication processes disclosed in U.S. Pat. No. 4,740,410 issued to Muller et al. entitled "MICROMECHANICAL ELEMENTS AND METHODS FOR THEIR FABRICATION," U.S. Pat. No. 5,660,680 issued to Chris Keller entitled "METHOD FOR FABRICATION OF HIGH VERTICAL ASPECT RATIO THIN FILM STRUCTURES," U.S. Pat. No. 5,645,684 issued to Chris Keller entitled "MULTILAYER HIGH VERTICAL ASPECT RATIO THIN FILM STRUCTURES," as well as the fabrication process disclosed in concurrently filed and commonly assigned U.S. patent application Ser. No. 09/569,330 entitled "METHOD AND SYSTEM FOR SELF-REPLICATING MANUFACTURING STATIONS," the disclosure of which is hereby incorporated herein by reference. Likewise, the various exemplary complementary handles provided herein may be fabricated utilizing any of various fabrication techniques, including those referenced above. However, a gripper and complementary handle may be fabricated utilizing any process now known or later developed, and such gripper and complementary handle are intended to be within the scope of the present invention irrespective of the process utilized to fabricate such gripper and complementary handle.

An example of the operation of gripper 700 in grasping a complementary handle is now provided, and a more full description of such an exemplary operation is provided in conjunction with FIG. 9 hereafter. Gripper 700 may be referred to as a "clip gripper" because clips 756 and 758 are utilized to grasp a complementary handle. Preferably, arms 752 and 754 approach a complementary handle such that the base members 786 and 788 of gripper 700 are inserted into apertures of the complementary handle. Once base members 786 and 788 are inserted into such apertures, a compression force may be applied on the gripper 700 causing the arms 752 and 754 to move toward each other. As the arms compress in this manner, the vertical tabs 772 and 776 of gripper 700 may each engage a portion of the complementary handle (e.g., engage an inner edge of the handle's apertures). As the vertical tabs 772 and 776 engage such a portion of the complementary handle, the protruding wedges 778 and 780 of the gripper's clips will be forced against their respective notches 782 and 784 on arms 752 and 754.

The protruding wedges 778 and 780 may engage the notches 782 and 784 to form, for example, a type of joint, in which the protruding wedges may rotate within the notch to allow the clips' tabs to move in a manner to grasp the complementary handle, as discussed more fully hereafter. As compression force continues being applied, the force being applied by the vertical tabs 772 and 776 against a portion of the complementary handle (e.g., the inner edge of the handle's apertures) cause the protruding wedges to rotate within their respective notches. More specifically, vertical tabs 772 and 776 are forced back toward their respective arms 752 and 754 causing the protruding wedges 778 and 780 to rotate within notches 782 and 784. As the protruding wedges 778 and 780 rotate, the horizontal tabs 770 and 774 of the clips rotate downward toward the upper surface of the complementary handle. That is, springs 760 and 762 expand enabling the horizontal tabs 770 and 774 to rotate downward toward the upper surface of the complementary handle. It should be recognized that when sufficient compression force is applied by the arms of gripper 700, the clips of the gripper will operate to "pinch" a portion of the complementary handle between the horizontal tabs 770 and 774 and the points 702 and 704 of base members 786 and 788. That is, the compression force causes the horizontal tabs 770 and 774 to rotate downward to engage the upper surface of a portion of the complementary handle, thereby applying a downward force against such portion. Additionally, base members 786 and 788 are positioned beneath such portion of the complementary handle when the gripper 700 compresses, and thus the clips operate to pinch such portion of the complementary handle between the horizontal tabs 770 and 774 and the base members 786 and 788, respectively, when sufficient compression force is applied by the gripper 700.

It should be understood that the clips implemented for a clip gripper, such as clips 756 and 758 described above, may be implemented in a variety of ways. Turning to FIGS. 8A and 8B, a preferable implementation for such clips is shown. Shown in FIG. 8A is a clip 804, which comprises a horizontal tab 806 and a vertical tab 808. As shown, tabs 806 and 808 are arranged at approximately a 90 degree angle respective to each other. Clip 804 further comprises a round wedge (or "dimple") 810. As described above, the dimple 810 may engage a "notch" to form a joint, which enables the clip 804 to rotate. As shown in FIG. 8A, such "notch" is preferably implemented as simply an inclined surface 802. For example, the notches 782 and 784 described above in FIG. 7 may be implemented simply as an inclined surface 802. As a result, the dimple 810 is capable of rolling against the inclined surface 802 with very little friction and slippage therebetween.

As shown in FIG. 8A, dimple 810 is initially separated a distance, shown as 812, away from the inclined surface 802. That is, in a preferred embodiment, when no force is applied against clip 804 (e.g., the clip 804 is at rest), dimple 810 is separated a distance 812 from inclined surface 802. As described in conjunction with FIG. 7 above, a compression force may be applied by the gripper to cause the clip 804 to move toward the handle, shown as 814. When sufficient compression force is applied by the gripper, the vertical tab 808 is moved to engage vertical edge 816 of handle 814, such that as the compression force continues to be applied, the clip 804 is forced back until dimple 810 engages inclined surface 802. That is, the clip 804 is forced back the separation distance 812 such that dimple 810 engages inclined surface 802. As shown, vertical tab 808 preferably includes a dimple 866 to reduce the amount of surface contact between such vertical tab 808 and the vertical edge 816 of handle 814. When the dimple 810 engages inclined surface 802 with compression force still being applied, the dimple 810 rolls against the inclined surface 802 such that the horizontal tab 806 engages the horizontal edge 818 of handle 814. Accordingly the handle 814 is pinched between the horizontal tab 806 and the base member 830 positioned under the handle 814. As shown, the horizontal tab 806 preferably includes dimples 862 and 864 to reduce the amount of surface area in contact between the horizontal tab 806 and the horizontal edge 818 of handle 814. For instance, as the gripper compresses, the handle 814 may be attracted to the tab 806 in a manner such that horizontal edge 818 of handle 814 attempts to contact horizontal tab 806 flushly.

Upon such an occurrence, dimples 862 and 864 aid in reducing the amount of surface area in contact, thus allowing the clip 804 to reposition itself with respect to handle 814 to grasp handle 814 in a desirable manner. Furthermore, dimple 864 aids in releasing the handle 814, once a desirable grasp is achieved.

Turning to FIG. 8B, clip 804 engaging handle 814 to enable the gripper to achieve a grasp of such handle 814 is shown. As shown, dimple 810 engages inclined surface 802, and has rolled against inclined surface 802 such that vertical tab 808 engages the vertical edge 816 of handle 814 at point 820 and horizontal tab 806 engages horizontal edge 818 of handle 814 at point 822 (with dimple 864). When this position is reached in a preferred embodiment, there is no slipping at the pivot contact point if there is no force in the plane of the incline and no net torque about the pivot. To illustrate this characteristic, first assume the second condition is true (there is no net torque about the pivot), and then compute the direction of the net force generated by the two contact points 820 and 822 against the handle 814. The angle of the incline is then established to be normal to this direction so that there will be no component of force in the plane of the incline. Thus, the above assumption will now be true because the configuration will be in equilibrium. In a most preferred embodiment, for a clip with a gripper displacement of 5 microns ($\mu$m) and an error of $+/-2.5$ $\mu$m, the magnitude of the force at 822 is 0.336 times the magnitude of the force at point 820. This gives an incline angle of approximately 58 degrees from horizontal, as shown in FIG. 8B.

As illustrated in FIG. 8B, clip 804 works to apply a force against handle 814 at points 820 and 822, such that the handle 814 is pinched between the clip 804 and the base member 830. As further illustrated in FIG. 8B, a relatively small amount of surface area in contact between the gripper and the handle 814 is achieved, thereby reducing the sticking effects between the gripper and the handle 814. For example, clip 804 contacts handle 814 at points 820 and 822, and the protruding point 832 of base member 830 engages the underside of handle 814. As a result, the gripper may easily release the handle 814 to accurately position the associated microcomponent to which the handle 814 is coupled.

As described above, a gripper may be implemented with clips to aid in rigidly grasping a complementary handle. Alternatively, a complementary handle may be implemented having clips that engage a gripper to aid the gripper in rigidly grasping such complementary handle. Furthermore, both the gripper and the complementary handle may be implemented having clips to engage each other in a manner that aids in achieving a rigid grasp of the complementary handle by the gripper. Turning now to FIG. 9, an exemplary "dual clip" implementation in which both a gripper 950 and a complementary handle 904 are implemented having clips to engage each other. For better illustration of this exemplary implementation, only one arm (i.e., arm 954) of the gripper 950 is shown and described. Exemplary handle 904 comprises a base layer 906, which is preferably fabricated as a first layer of polysilicon (i.e., "poly 1 layer"). A "slot" (or "aperture") 908 is included within the poly 1 layer 906. A portion of the poly 1 layer 906 is covered by a second layer 914, which is preferably a second layer of polysilicon (i.e., "poly 2 layer"). The second layer 914 is implemented over the mid-section of the slot 908, thereby effectively dividing the slot 908 into two apertures 910 and 912. As shown in aperture 910, the interior wall of such aperture preferably includes dimples, such as dimples 997, to reduce the amount of surface area in contact between such interior wall and an engaging gripper.

Additionally, handle 904 includes clips 932 and 938 that engage the gripper's arms, such as arm 954, when sufficient compression force is applied by the gripper, as will be described more fully below. Most preferably, clips 932 and 938 are springably coupled within handle 904 (although a coupling spring is not shown in FIG. 9). In the exemplary implementation of FIG. 9, clip 932 includes two tabs that are arranged at approximately 90 degree angles to each other. More specifically, clip 932 includes a first tab 936, which may be referred to as a "trigger tab," and second tab 934, which maybe referred to as an engaging tab. Additionally, in the exemplary implementation of FIG. 9, clip 932 includes a protruding wedge, shown as wedge 940, which may be a dimple as described above in conjunction with FIGS. 8A and 8B. Further, handle 904 includes a notch 944 for receiving the protruding wedge 940 of clip 932, and such notch may be implemented as an inclined surface as described above in conjunction with FIGS. 8A and 8B.

A portion of a gripper 950 is shown, which is similar to gripper 700 described above in conjunction with FIG. 7. Gripper 950 may be used to grasp the complementary handle 904. Preferably, gripper 950 comprises two arms, one of which is shown as arm 954. Preferably, the second arm would be implemented as substantially a mirror image of the first arm 954, similar to the clip gripper 700 implementation shown and described above in conjunction with FIG. 7. Preferably, each arm has a range of motion to enable compression of the arms toward each other to grasp complementary handle 904. Each arm of gripper 950 includes a clip, such as clip 958. Most preferably, such clip 958 is springably coupled to arm 954, in a similar manner as described above for the clip gripper implementation of FIG. 7 (although the coupling spring is not shown in the exemplary implementation of FIG. 9). In the exemplary implementation of FIG. 9, clip 958 includes two tabs that are arranged at. approximately 90 degree angles to each other. More specifically, clip 958 includes horizontal tab 974 and vertical tab 976. Additionally, in the exemplary implementation of FIG. 9, clip 958 includes a protruding wedge, shown as wedge 980, which may be a dimple as described above in conjunction with FIGS. 8A and 8B. Further, arm 954 includes a notch 984 for receiving the protruding wedge 980 of clip 958, and such notch may be implemented as an inclined surface as described above in conjunction with FIGS. 8A and 8B. Gripper 950 also includes base members (not shown), which extend from the gripper's arms beneath the second layer 914 of handle 904 when the gripper 950 grasps handle 904.

In the exemplary implementation of FIG. 9, clip 958 of gripper 950 is utilized to grasp complementary handle 904. More specifically, as sufficient compression force is applied by the gripper 950, the clip 958 rotates about an axis horizontal to the handle, such that the clip 958 engages the handle in the manner shown in FIG. 8B. Additionally, in this exemplary dual-clip implementation, the clip 932 of handle 904 also engages gripper 950 to aid in achieving a rigid grasp therebetween. As a compression force is applied by the gripper 950 causing the gripper's arms to move toward each other, the handle's clips 932 and 938 engage the gripper's arms. For example, as arm 954 moves toward the second layer 914 of handle 904 (as a result of the applied compression force), member 930 of arm 954 engages tab 936 (e.g., the "trigger tab") of clip 934. As member 930 of arm 954 applies force against the trigger tab 936 due to the compression force being applied by the gripper 950, the protruding wedge 940 of clip 932 will be forced against its respective notch 944 within handle 904.

As compression force continues being applied, the force being applied by member 930 against tab 936 causes the protruding wedge 940 to rotate within its respective notch 944 about an axis vertical to the handle 904. More specifically, trigger tab 936 is forced back further causing the protruding wedge 940 to rotate within notch 944. As the protruding wedge 940 rotates, tab 934 (e.g., "engaging tab") of clip 932 rotates toward the surface of member 930 of arm 954. Thus, as the member 930 applies sufficient force against trigger tab 936, it causes engaging tab 934 to engage the surface of arm 954. It should be recognized that when sufficient compression force is applied by the arms of gripper 950, the clips 932 and 938 of the handle 904 will operate to apply a force against the gripper's arms along the Y axis of FIG. 9. It should further be recognized that when sufficient compression force is applied by the arm 954 of gripper 950, the clip 932 of the handle 904 will operate to "pinch" the arm 954 between the engaging tab 934 and the inner wall of aperture 912 on the opposing side of arm 954. That is, the compression force causes the engaging tab 934 to rotate to engage the surface of the arm 954 on one side, thereby applying a force against the arm 954. The inner wall of aperture 912 is on the opposite side of arm 954, and thus the clip 932 operates to pinch the arm 954 between the engaging tab 934 and the opposing inner wall of aperture 912 within handle 904 when sufficient compression force is applied by the gripper 950.

The exemplary implementation of the clip gripper 950 and complementary handle 904 of FIG. 9 enable clip gripper 950 to achieve a relatively rigid grasp of handle 904. For instance, clip gripper 950 may provide a relatively rigid grasp of handle 904 along the Z and X axes in a manner similar to that described above in conjunction with FIG. 6C. That is, the clip gripper 950 may grasp the handle 904 such that the handle 904 does not tend to move in either direction along the Z axis or either direction along the X axis relative to the gripper 950. Additionally, the clip handle 904 may enable arm 954 to achieve a relatively rigid grasp of handle 904 such that handle 904 does not move in either direction along Y axis direction of FIG. 9 relative to gripper 950. For instance, in the exemplary implementation of FIG. 9, friction between the gripper 950 and the handle 904 is not relied on for maintaining rigidity along any of the X, Y, or Z axes. Thus, the exemplary implementation of FIG. 9 may be utilized to grasp a handle 904 in a manner that provides rigidity between the gripper 950 and handle 904, constraining all six degrees of freedom (i.e. both translational and rotational degrees of freedom).

It should be recognized that the clip gripper and clip handle may be utilized together in a dual clip implementation as described above in conjunction with FIG. 9. Alternatively a clip gripper may be utilized with a handle that does not include clips, or a clip handle may be utilized with a gripper that does not include clips. While the dual clip implementation is preferable because of the rigidity of a grasped component provided thereby, any such alternative implementation in which clips are utilized within only a gripper or within only a handle are intended to be included within the scope of the present invention.

Furthermore, it should be understood that to achieve complete rigidity between a gripper and a handle, the grasped handle must have six degrees of freedom constrained relative to the gripper. More specifically, all degrees of translational freedom and all degrees of rotational freedom of the grasped handle must be constrained relative to the gripper. It should be recognized that the various embodiments provided herein may be implemented to constrain all degrees of translational freedom and all degrees of rotational freedom of a grasped handle relative to the gripper. While certain embodiments may constrain particular degrees of freedom more than others, such embodiments may be implemented to provide at least a minimal constraint on all six degrees of freedom. Of course, the embodiments may be implemented to constrain less than all six degrees of freedom, and any such implementation is intended to be encompassed within the scope of the present invention. For example, one or more of the embodiments may be implemented to constrain a grasped handle in all translational degrees of freedom relative to the gripper, but not in all rotational degrees of freedom. Because providing complete rigidity (i.e., constraint of a handle in all degrees of freedom relative to a gripper) is typically desirable in performing pick-and-place operations, the present invention discloses a desirable gripper and complementary handle that may be utilized to provide such complete rigidity.

Again, it should be recognized that the above implementations of a gripper and complementary handle are intended solely as examples that render the disclosure enabling for many other implementations, and any other such implementation of a gripper and complementary handle is intended to be within the scope of the present invention. In a most preferred embodiment, a gripper and complementary handle are implemented to enable a microcomponent to be effectively grasped by the gripper and released without requiring an external adhesion force between the grasped microcomponent and the target location for accurate placement of the grasped microcomponent on the target location. Alternatively, only a relatively small external adhesion force may be required at the target location for accurate placement of the grasped microcomponent on the target location. Of course, in various implementations, an external adhesion force between the microcomponent and the target location may be utilized, and any such implementation is intended to be within the scope of the present invention. For example, a connector as disclosed in concurrently filed and commonly assigned U.S. patent application Ser. No. 09/570,170 entitled "SYSTEM AND METHOD FOR COUPLING MICROCOMPONENTS," which is hereby incorporated herein by reference, may be utilized to assist in accurate placement of a grasped microcomponent in a desired target location.

It should be understood that in various implementations multiple handles of differing types may be arranged within a single microcomponent to allow for differing types of grippers to be utilized to achieve a grasp of the microcomponent, and any such implementation is intended to be within the scope of the present invention. Additionally, in various implementations multiple handles of the same or differing types may be arranged within a single microcomponent to allow for various positions and/or orientations at which the microcomponent may be grasped by a gripper, and any such implementation is intended to be within the scope of the present invention.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method of grasping a microcomponent, said method comprising the steps of:

providing a handle on a microcomponent, wherein said handle is complementary to at least a portion of a gripper device to aid said gripper device in achieving a desirable grasp of said handle; and obtaining a grasp of said microcomponent with said gripper device by grasping said handle with said gripper device.

2. The method of claim 1 wherein said obtaining a grasp step further includes:

at least two arms of said gripper device engaging said handle.

3. The method of claim 2 wherein said handle includes at least one aperture for receiving said at least two arms of said gripper device.

4. The method of claim 2 wherein said obtaining a grasp step further includes:

a notch on each of said at least two arms engaging said handle.

5. The method of claim 4 wherein said notch on each of said at least two arms aids in aligning said gripper device with said handle.

6. The method of claim 4 wherein said handle includes at least one notch for receiving said notch on each of said at least two arms.

7. The method of claim 6 wherein said notch included on said handle aids in aligning said gripper device with said handle.

8. The method of claim 1 wherein said handle includes at least one aperture for receiving at least a portion of said gripper device.

9. The method of claim 1 wherein said obtaining a grasp step further includes:

at least one notch included in said handle being engaged by said gripper device.

10. The method of claim 9 wherein said at least one notch included in said handle aids in aligning said gripper device with said handle.

11. The method of claim 1 wherein said obtaining a grasp step further includes:

at least one clip of said gripper device engaging said handle.

12. The method of claim 11 wherein said at least one clip is springably coupled to said gripper device.

13. The method of claim 12 wherein said at least one clip is springably coupled to at least one arm of said gripper device.

14. The method of claim 11 wherein said obtaining a grasp step further includes:

pinching a portion of said handle between said at least one clip and a base member of said gripper device.

15. The method of claim 1 wherein said obtaining a grasp step further includes:

said gripper device grasping said handle in a manner that constrains three degrees of translational freedom of said handle relative to said gripper device.

16. The method of claim 15 wherein said obtaining a grasp step further includes:

said gripper device grasping said handle in a manner that constrains three degrees of translational freedom of said microcomponent relative to said gripper device.

17. The method of claim 1 wherein said obtaining a grasp step further includes:
said gripper device grasping said handle in a manner that constrains three degrees of rotational freedom of said handle relative to said gripper device.

18. The method of claim 17 wherein said obtaining a grasp step further includes:
said gripper device grasping said handle in a manner that constrains three degrees of rotational freedom of said microcomponent relative to said gripper device.

19. The method of claim 1 wherein said obtaining a grasp step further includes:
said gripper device grasping said handle in a manner that constrains three degrees of translational freedom and three degrees of rotational freedom of said handle relative to said gripper device.

20. The method of claim 19 wherein said obtaining a grasp step further includes:
said gripper device grasping said handle in a manner that constrains three degrees of translational freedom and three degrees of rotational freedom of said microcomponent relative to said gripper device.

21. The method of claim 1 wherein said handle is no larger than said microcomponent.

22. The method of claim 1 wherein said gripper device is a micro-gripper device.

23. The method of claim 1 wherein said step of obtaining a grasp of said microcomponent comprises:
said gripper device engaging said handle in a manner that minimizes the amount of surface contact between said gripper device and said handle.

24. A system for grasping a microcomponent, said system comprising:
a handle on said microcomponent, wherein said handle is designed to be complementary to at least a portion of a gripper device to aid said gripper device in achieving a grasp of said handle.

25. The system of claim 24 wherein said handle is an integrated part of said microcomponent.

26. The system of claim 24 wherein said handle is a separate part coupled to said microcomponent.

27. The system of claim 24 wherein said gripper device further includes:
at least two arms for engaging said handle.

28. The system of claim 27 wherein said handle includes at least one aperture for receiving said at least two arms of said gripper device.

29. The system of claim 27 wherein said at least two arms each include:
a notch for engaging said handle.

30. The system of claim 29 wherein said notch on each of said at least two arms aids in aligning said gripper device with said handle.

31. The system of claim 29 wherein said handle includes at least one notch for receiving said notch on each of said at least two arms.

32. The system of claim 31 wherein said notch included on said handle aids in aligning said gripper device with said handle.

33. The system of claim 24 wherein said handle includes at least one aperture for receiving at least a portion of said gripper device.

34. The system of claim 24 wherein said handle further includes:
at least one notch arranged for being engaged by said gripper device.

35. The system of claim 34 wherein said at least one notch included in said handle aids in aligning said gripper device with said handle.

36. The system of claim 24 wherein said gripper device further includes:
at least one clip for engaging said handle.

37. The system of claim 36 wherein said at least one clip is springably coupled to said gripper device.

38. The system of claim 37 wherein said at least one clip is springably coupled to at least one arm of said gripper device.

39. The system of claim 36 wherein said clip is arranged in said gripper device to pinch a portion of said handle between said at least one clip and a base member of said gripper device when said gripper device engages said handle.

40. The system of claim 36 wherein said handle further includes at least one clip arranged to engage said gripper device.

41. The system of claim 40 wherein said at least one clip of said handle is springably coupled to said handle.

42. The system of claim 40 wherein said at least one clip of said handle is arranged in said handle to pinch a portion of said gripper device between said at least one clip of said handle and another portion of said handle when said gripper device engages said handle.

43. The system of claim 24 wherein said handle further includes at least one clip arranged to engage said gripper device.

44. The system of claim 43 wherein said at least one clip of said handle is springably coupled to said handle.

45. The system of claim 43 wherein said at least one clip of said handle is arranged in said handle to pinch a portion of said gripper device between said at least one clip of said handle and another portion of said handle when said gripper device engages said handle.

46. The system of claim 24 wherein said gripper device is capable of grasping said handle in a manner that constrains three degrees of translational freedom of said handle relative to said gripper device.

47. The system of claim 46 wherein said gripper device is capable of grasping said handle in a manner that constrains three degrees of translational freedom of said microcomponent relative to said gripper device.

48. The system of claim 24 wherein said gripper device is capable of grasping said handle in a manner that constrains three degrees of rotational freedom of said handle relative to said gripper device.

49. The system of claim 48 wherein said gripper device is capable of grasping said handle in a manner that constrains three degrees of rotational freedom of said microcomponent relative to said gripper device.

50. The system of claim 24 wherein said gripper device is capable of grasping said handle in a manner that constrains three degrees of translational freedom and three degrees of rotational freedom of said handle relative to said gripper device.

51. The system of claim 50 wherein said gripper device is capable of grasping said handle in a manner that constrains three degrees of translational freedom and three degrees of rotational freedom of said microcomponent relative to said gripper device.

52. The system of claim 24 wherein said handle is no larger than said microcomponent.

53. A gripper and complementary handle for grasping a microcomponent; said gripper including a mechanism for engaging said complementary handle; and said complementary handle implemented on said microcomponent and said complementary handle including a complementary receptacle for said gripper to engage to achieve a grasp of said microcomponent.

54. The gripper and complementary handle of claim 53 wherein said complementary handle is an integrated part of said microcomponent.

55. The gripper and complementary handle of claim 53 wherein said complementary handle is a separate part coupled to said microcomponent.

56. The gripper and complementary handle of claim 53 wherein said gripper further includes:
at least two arms for engaging said complementary handle.

57. The gripper and complementary handle of claim 56 wherein said complementary handle includes at least one aperture for receiving said at least two arms of said gripper device.

58. The gripper and complementary handle of claim 56 wherein said at least two arms each include:
a notch for engaging said complementary handle.

59. The gripper and complementary handle of claim 58 wherein said notch on each of said at least two arms aids in aligning said gripper with said complementary handle.

60. The gripper and complementary handle of claim 58 wherein said complementary handle includes at least one notch for receiving said notch on each of said at least two arms.

61. The gripper and complementary handle of claim 60 wherein said notch included on said complementary handle aids in aligning said gripper with said complementary handle.

62. The gripper and complementary handle of claim 53 wherein said complementary handle includes at least one aperture for receiving at least a portion of said gripper.

63. The gripper and complementary handle of claim 53 wherein said complementary handle further includes:
at least one notch arranged for being engaged by said gripper.

64. The gripper and complementary handle of claim 63 wherein said at least one notch included in said complementary handle aids in aligning said gripper with said complementary handle.

65. The gripper and complementary handle of claim 53 wherein said gripper further includes:
at least one clip for engaging said complementary handle.

66. The gripper and complementary handle of claim 65 wherein said at least one clip is springably coupled to said gripper.

67. The gripper and complementary handle of claim 66 wherein said at least one clip is springably coupled to at least one arm of said gripper.

68. The gripper and complementary handle of claim 65 wherein said clip is arranged in said gripper to pinch a portion of said complementary handle between said at least one clip and a base member of said gripper when said gripper engages said complementary handle.

69. The gripper and complementary handle of claim 65 wherein said complementary handle further includes at least one clip arranged to engage said gripper.

70. The gripper and complementary handle of claim 69 wherein said at least one clip of said complementary handle is springably coupled to said complementary handle.

71. The gripper and complementary handle of claim 69 wherein said at least one clip of said complementary handle is arranged in complementary handle to pinch a portion of said gripper between said at least one clip of said complementary handle and another portion of said complementary handle when said gripper engages said complementary handle.

72. The gripper and complementary handle of claim 53 wherein said complementary handle further includes at least one clip arranged to engage said gripper.

73. The gripper and complementary handle of claim 72 wherein said at least one clip of said complementary handle is springably coupled to said complementary handle.

74. The complementary handle of claim 72 wherein said at least one clip of said complementary handle is arranged in said complementary handle to pinch a portion of said gripper between said at least one clip of said complementary handle and another portion of said complementary handle when said gripper engages said complementary handle.

75. The gripper and complementary handle of claim 53 wherein said gripper is capable of grasping said complementary handle in a manner that constrains three degrees of translational freedom of said complementary handle relative to said gripper.

76. The gripper and complementary handle of claim 75 wherein said gripper is capable of grasping said complementary handle in a manner that constrains three degrees of translational freedom of said microcomponent relative to said gripper.

77. The gripper and complementary handle of claim 53 wherein said gripper is capable of grasping said complementary handle in a manner that constrains three degrees of rotational freedom of said complementary handle relative to said gripper.

78. The gripper and complementary handle of claim 77 wherein said gripper is capable of grasping said complementary handle in a manner that constrains three degrees of rotational freedom of said microcomponent relative to said gripper.

79. The gripper and complementary handle of claim 53 wherein said gripper is capable of grasping said complementary handle in a manner that constrains three degrees of translational freedom and three degrees of rotational freedom of said complementary handle relative to said gripper.

80. The gripper and complementary handle of claim 79 wherein said gripper is capable of grasping said complementary handle in a manner that constrains three degrees of translational freedom and three degrees of rotational freedom of said microcomponent relative to said gripper.

81. The gripper and complementary handle of claim 53 wherein said complementary handle is no larger than said microcomponent.

82. The gripper and complementary handle of claim 53 wherein said gripper is a micro-gripper.

83. A gripper for engaging a micro-handle on a microcomponent to achieve a grasp of said microcomponent, said gripper comprising
one or more engaging mechanism, said one or more engaging mechanism being complementary to said micro-handle; and
said one or more engaging mechanism capable of exerting a force against said micro-handle to achieve a grasp of said microcomponent.

84. The gripper of claim 83 wherein said one or more engaging mechanism includes:
a notch for engaging said micro-handle.

85. The gripper of claim 84 wherein said notch aids in aligning said gripper with said micro-handle.

86. The gripper of claim 83 wherein said gripper is capable of grasping said micro-handle in a manner that constrains three degrees of translational freedom of said micro-handle relative to said gripper.

87. The gripper of claim 86 wherein said gripper is capable of grasping said micro-handle in a manner that constrains three degrees of translational freedom of said microcomponent relative to said gripper.

88. The gripper of claim 83 wherein said gripper is capable of grasping said micro-handle in a manner that constrains three degrees of rotational freedom of said micro-handle relative to said gripper.

89. The gripper of claim 88 wherein said gripper is capable of grasping said micro-handle in a manner that constrains three degrees of rotational freedom of said microcomponent relative to said gripper.

90. The gripper of claim 83 wherein said gripper is capable of grasping said micro-handle in a manner that constrains three degrees of translational freedom and three degrees of rotational freedom of said micro-handle relative to said gripper.

91. The gripper of claim 90 wherein said gripper is capable of grasping said micro-handle in a manner that constrains three degrees of translational freedom and three degrees of rotational freedom of said microcomponent relative to said gripper.

92. A gripper for engaging a handle on a microcomponent to achieve a grasp of said microcomponent, said gripper comprising
   one or more engaging mechanism, said one or more engaging mechanism being complementary to said handle, wherein said one or more engaging mechanism includes at least one clip for engaging said handle; and
   said one or more engaging mechanism capable of exerting a force against said handle to achieve a grasp of said microcomponent.

93. The gripper of claim 92 wherein said at least one clip is springably coupled to said gripper.

94. The gripper of claim 93 wherein said at least one clip is springably coupled to said one or more engaging mechanism.

95. The gripper of claim 92 wherein said clip is arranged in said gripper to pinch a portion of said handle between said at least one clip and a base member of said gripper when said gripper engages said handle.

96. The gripper of claim 92 wherein said handle is no larger than said microcomponent.

97. A handle for aiding a gripper mechanism to achieve a desirable grasp of a microcomponent, said handle comprising:
   one or more receptacle implemented on a microcomponent, said one or more receptacle being complementary to one or more engaging portion of a gripper mechanism to enable said gripper mechanism to achieve a grasp of said microcomponent by said one or more engaging portion of said gripper mechanism engaging said one or more receptacle implemented on said microcomponent.

98. The handle of claim 97 wherein said handle is an integrated part of said microcomponent.

99. The handle of claim 97 wherein said handle is a separate part coupled to said microcomponent.

100. The handle of claim 97 wherein said receptacle includes at least one aperture for receiving at least a portion of said gripper mechanism.

101. The handle of claim 97 further including:
   at least one notch arranged for being engaged by said gripper mechanism.

102. The handle of claim 101 wherein said at least one notch aids in aligning said gripper mechanism with said receptacle.

103. The handle of claim 97 further including:
   at least one clip arranged to engage said gripper mechanism.

104. The handle of claim 103 wherein said at least one clip is springably coupled to said handle.

105. The handle of claim 103 wherein said at least one clip is arranged to pinch a portion of said gripper mechanism between said at least one clip and another portion of said handle when said gripper mechanism engages said receptacle.

106. The handle of claim 97 wherein said handle is complementary to said gripper mechanism in a manner such that three degrees of translational freedom of said handle are constrained relative to said gripper mechanism when said gripper mechanism grasps said handle.

107. The handle of claim 106 wherein said handle is complementary to said gripper mechanism in a manner such that three degrees of translational freedom of said microcomponent are constrained relative to said gripper mechanism when said gripper mechanism grasps said handle.

108. The handle of claim 97 wherein said handle is complementary to said gripper mechanism in a manner such that three degrees of rotational freedom of said handle are constrained relative to said gripper mechanism when said gripper mechanism grasps said handle.

109. The handle of claim 108 wherein said handle is complementary to said gripper mechanism in a manner such that three degrees of rotational freedom of said microcomponent are constrained relative to said gripper mechanism when said gripper mechanism grasps said handle.

110. The handle of claim 97 wherein said handle is complementary to said gripper mechanism in a manner such that three degrees of translational freedom, and three degrees of rotational freedom of said handle are constrained relative to said gripper mechanism when said gripper mechanism grasps said handle.

111. The handle of claim 110 wherein said handle is complementary to said gripper mechanism in a manner such that three degrees of translational freedom and three degrees of rotational freedom of said microcomponent are constrained relative to said gripper mechanism when said gripper mechanism grasps said handle.

112. The handle of claim 97 wherein said handle is no larger than said microcomponent.

113. A method for performing pick-and-place operations on a microcomponent, said method comprising the steps of:
   providing a gripper device;
   providing a handle on a microcomponent, wherein said handle is complementary to said gripper device to aid said gripper device in achieving a grasp of said handle;
   obtaining a grasp of said microcomponent with said gripper device by grasping said handle with said gripper device;
   positioning said grasped microcomponent to a target location with said gripper device; and
   releasing said grasped microcomponent at said target location by said gripper device releasing said handle.

114. The method of claim 113 wherein said obtaining a grasp step further includes:
   engaging said handle with at least two arms of said gripper device.

115. The method of claim 114 wherein said handle includes at least one aperture for receiving said at least two arms of said gripper device.

116. The method of claim 114 wherein said obtaining a grasp step further includes:

engaging said handle with a notch included on each of said at least two arms.

117. The method of claim 116 wherein said notch on each of said at least two arms aids in aligning said gripper device with said handle.

118. The method of claim 116 wherein said handle includes at least one notch for receiving said notch on each of said at least two arms.

119. The method of claim 118 wherein said notch included on said handle aids in aligning said gripper device with said handle.

120. The method of claim 113 wherein said obtaining a grasp step further includes:

engaging at least one notch included in said handle by said gripper device.

121. The method of claim 120 wherein said at least one notch included in said handle aids in aligning said gripper device with said handle.

122. The method of claim 113 wherein said obtaining a grasp step further includes:

engaging said handle with at least one clip included in said gripper device.

123. The method of claim 122 wherein said at least one clip is springably coupled to said gripper device.

124. The method of claim 123 wherein said obtaining a grasp step further includes:

pinching a portion of said handle between said at least one clip and a base member of said gripper device.

125. The method of claim 113 wherein said obtaining a grasp step further includes:

said gripper device grasping said handle in a manner that constrains three degrees of translational freedom of said handle relative to said gripper device.

126. The method of claim 125 wherein said obtaining a grasp step further includes:

said gripper device grasping said handle in a manner that constrains three degrees of translational freedom of said microcomponent relative to said gripper device.

127. The method of claim 113 wherein said obtaining a grasp step further includes:

said gripper device grasping said handle in a manner that constrains three degrees of rotational freedom of said handle relative to said gripper device.

128. The method of claim 127 wherein said obtaining a grasp step further includes:

said gripper device grasping said handle in a manner that constrains three degrees of rotational freedom of said microcomponent relative to said gripper device.

129. The method of claim 113 wherein said obtaining a grasp step further includes:

said gripper device grasping said handle in a manner that constrains three degrees of translational freedom and three degrees of rotational freedom of said handle relative to said gripper device.

130. The method of claim 129 wherein said obtaining a grasp step further includes:

said gripper device grasping said handle in a manner that constrains three degrees of translational freedom and three degrees of rotational freedom of said microcomponent relative to said gripper device.

131. The method of claim 113 wherein said handle is no larger than said microcomponent.

132. The method of claim 113 wherein said step of obtaining a grasp of said microcomponent comprises:

said gripper device engaging said handle with sufficiently small amount of surface contact between said gripper device and said handle to enable said gripper device to accurately release the grasped microcomponent at said target location in said releasing step.

133. A system comprising:

means for gripping a microcomponent; and handle means on said microcomponent, wherein said handle means is no larger than said microcomponent and is complementary to said gripping means for enabling said gripping means to achieve a desirable grasp of said microcomponent.

134. The system of claim 133 wherein said gripping means further includes:

at least one means for pinching said handle means.

135. The system of claim 134 wherein said means for pinching is arranged to pinch a portion of said handle means when said gripping means engages said handle means.

136. The system of claim 133 wherein said handle means further includes at least one means for pinching said gripping means.

137. The system of claim 136 wherein said at least one means for pinching said gripping means is arranged to pinch a portion of said gripping means when said gripping means engages said handle means.

138. The system of claim 133 wherein said gripping means is capable of grasping said handle means in a manner that constrains three degrees of translational freedom of said handle means relative to said gripping means.

* * * * *

UNITED STATES PATENT AND TRADEMARK OFFICE
CERTIFICATE OF CORRECTION

PATENT NO.   : 6,398,280 B1
DATED        : June 4, 2002
INVENTOR(S)  : Eric G. Parker et al.

It is certified that error appears in the above-identified patent and that said Letters Patent is hereby corrected as shown below:

Column 9,
Line 19, delete "-*"

Column 10,
Line 10, delete "140"
Line 43, delete "$5122_B$" and insert -- $512_B$ --

Column 24,
Line 11, delete "The complementary handle" and insert -- The gripper and complementary handle --

Signed and Sealed this

Second Day of September, 2003

JAMES E. ROGAN
*Director of the United States Patent and Trademark Office*